(12) United States Patent
Chang et al.

(10) Patent No.: US 7,141,996 B2
(45) Date of Patent: Nov. 28, 2006

(54) FLIP CHIP TEST STRUCTURE

(75) Inventors: Keeny Chang, Taipei (TW); Shelton Lu, Taipei (TW)

(73) Assignee: Via Technologies, Inc., Taipei (TW)

( * ) Notice: Subject to any disclaimer, the term of this patent is extended or adjusted under 35 U.S.C. 154(b) by 175 days.

(21) Appl. No.: 10/429,845

(22) Filed: May 6, 2003

(65) Prior Publication Data

US 2004/0061515 A1   Apr. 1, 2004

(30) Foreign Application Priority Data

Sep. 30, 2002   (TW) .............................. 91122568 A

(51) Int. Cl.
*G01R 31/02* (2006.01)
(52) U.S. Cl. ...................... 324/755; 324/754; 324/761
(58) Field of Classification Search ................ 324/755, 324/765, 754, 758, 158.1; 257/48; 438/14, 438/17, 18
See application file for complete search history.

(56) References Cited

U.S. PATENT DOCUMENTS

| 5,132,613 | A | * | 7/1992 | Papae et al. ................ 324/754 |
| 5,477,160 | A | * | 12/1995 | Love .......................... 324/755 |
| 5,500,605 | A | * | 3/1996 | Chang ........................ 324/758 |
| 5,534,784 | A | * | 7/1996 | Lum et al. ................... 324/757 |
| 6,033,233 | A | * | 3/2000 | Haseyama et al. ............ 439/66 |
| 6,064,217 | A | * | 5/2000 | Smith ......................... 324/760 |
| 6,292,003 | B1 | * | 9/2001 | Fredrickson et al. ........ 324/754 |
| 6,396,292 | B1 | * | 5/2002 | Hembree et al. ........... 324/755 |
| 6,433,410 | B1 | | 8/2002 | Tanioka et al. |
| 6,541,365 | B1 | * | 4/2003 | Edwards et al. ............ 438/612 |
| 6,690,185 | B1 | * | 2/2004 | Khandros et al. ........... 324/758 |
| 6,720,787 | B1 | * | 4/2004 | Kimura et al. .............. 324/765 |
| 6,984,996 | B1 | * | 1/2006 | DiOrio et al. .............. 324/754 |

FOREIGN PATENT DOCUMENTS

WO   WO 02/15260 A1 *   2/2002

* cited by examiner

*Primary Examiner*—Minh N. Tang
(74) *Attorney, Agent, or Firm*—Rosenberg, Klein & Lee

(57) ABSTRACT

A flip chip test structure is disclosed. The flip chip test structure utilizes a substrate used in flip chip package to replace the conventional transformer of a flip chip wafer probe card. The substrate-transformer replacement reduces the cost and simplifies the flip chip wafer probe card manufacturing process since the substrate is already available and matches the chip being tested while the transformer needs additional design and custom fabrication which are expensive and time-wasting for corresponding chip being tested.

15 Claims, 4 Drawing Sheets

FLIP CHIP TEST STRUCTURE

BACKGROUND OF THE INVENTION

1. Field of the Invention

The present invention relates to a flip chip test structure, and more particularly to a low cost flip chip test structure.

2. Description of the Related Art

FIGS. 1 and 2 respectively show two conventional flip chip wafer probe cards. As shown in FIG. 1, the flip chip wafer probe card comprises a probe card printed circuit board (PCB) 102 and a transformer 104. The printed circuit board 102 has circuits for transmitting signals from the transformer 104 to a test equipment (not shown). The transformer 104 is used as a signal distribution interface between the printed circuit board 102 and the tested chips. The transformer 104 has circuits therein and contacts on one side to transmit test signals to the printed circuit board 102. The transformer 104 has probes 106 which are used to contact input/output pads of the tested chips. The transformer 104 is replaceable and must be redesigned and manufactured for testing various kinds of chips. FIG. 2 shows another configuration of a conventional flip chip wafer probe card. The flip chip wafer probe card comprises a probe card printed circuit board (PCB) 202 and a transformer 206. The transformer 206 transmits test signals to the probe card printed circuit board 202 through contacts 204. The transformer 206 has a probe frame 208 used to contact input/output pads of the tested chips.

When the conventional flip chip wafer probe cards are used to test flip chip package dies, the probe 106 or the probe frame 208 contact with the pads of the flip chip package dies. The probe 106 or the probe frame 208 transmit test signals to the transformers 104 or 206 and the transformers 104 or 206 distribute signals to a bigger signal pitches which is suitable to requirements of PCB layout. The transformers 104 or 206 then transmit the bigger-pitched signals to PCB of the probe card.

However, the conventional transformer has several disadvantages. The conventional transformers are made of ceramic material and the manufacturing tooling costs are expensive. Moreover, since one type of transformer is usually designed and manufactured only for a certain chip and few number of the transformer are need, the cost of chip test is very high because the expensive tooling charge is divided by only few transformers.

Similarly, a probe card PCB needs to match a transformer very well so that either an interposer 103 or solder balls 204 can connect probe card PCB and transformer with good electrical performance. The design and tooling cost of probe card PCB is also expensive due to the same reason that only few probe card PCBs are made. The design, tooling cost and actual manufacturing few transformers and probe card PCB can be 5 to 10 times more expensive compared to conventional non-flip chip probe card. This adds burden to flip chip manufacturing in terms of break-even point.

In view of the drawbacks mentioned with the prior art flip chip test probe card, there is a continued need to develop new and improved flip chip test structures that overcome the disadvantages associated with prior art.

SUMMARY OF THE INVENTION

It is therefore an object of the invention to provide a flip chip test structure which can reduce chip testing cost.

It is another object of this invention to provide a flip chip test structure which can simplify the chip test process and save the chip test preparation cycle time.

It is another object of this invention to provide a flip chip test structure which can provide a most suitable testing condition.

To achieve these objects, and in accordance with the purpose of the invention, the invention provides a flip chip test structure, the test structure comprises a substrate used in flip chip package and means for holding substrate and communicating signal transmitting the distributed test signals from the substrate to a test apparatus, wherein the substrate communicates between a chip being tested and the means for holding substrate and communicating signal, and distributes test signals from the chip being tested. The test apparatus further includes a well-matched PCB that provides good electrical connections between flip chip substrate and testing equipment.

It is to be understood that both the foregoing general description and the following detailed description are exemplary and explanatory only and are not restrictive of the invention, as claimed.

BRIEF DESCRIPTION OF THE DRAWINGS

The foregoing aspects and many of the attendant advantages of this invention will become more readily appreciated it becomes better understood by reference to the following detailed description, when taken in conjunction with the accompanying drawings, wherein.

DESCRIPTION OF THE PREFERRED EMBODIMENT

It is to be understood and appreciated that the process steps and structures described below do not cover a complete process flow and structures. The present invention can be practiced in conjunction with various fabrication techniques that are used in the art, and only so many of the commonly practiced process steps and structures are included herein as are necessary to provide an understanding of the present invention.

The present invention will be described in detail with reference to the accompanying drawings. It should be noted that the drawings are in greatly simplified form and they are not drawn to scale. Moreover, dimensions have been exaggerated in order to provide a clear illustration and understanding of the present invention.

Figure 1:
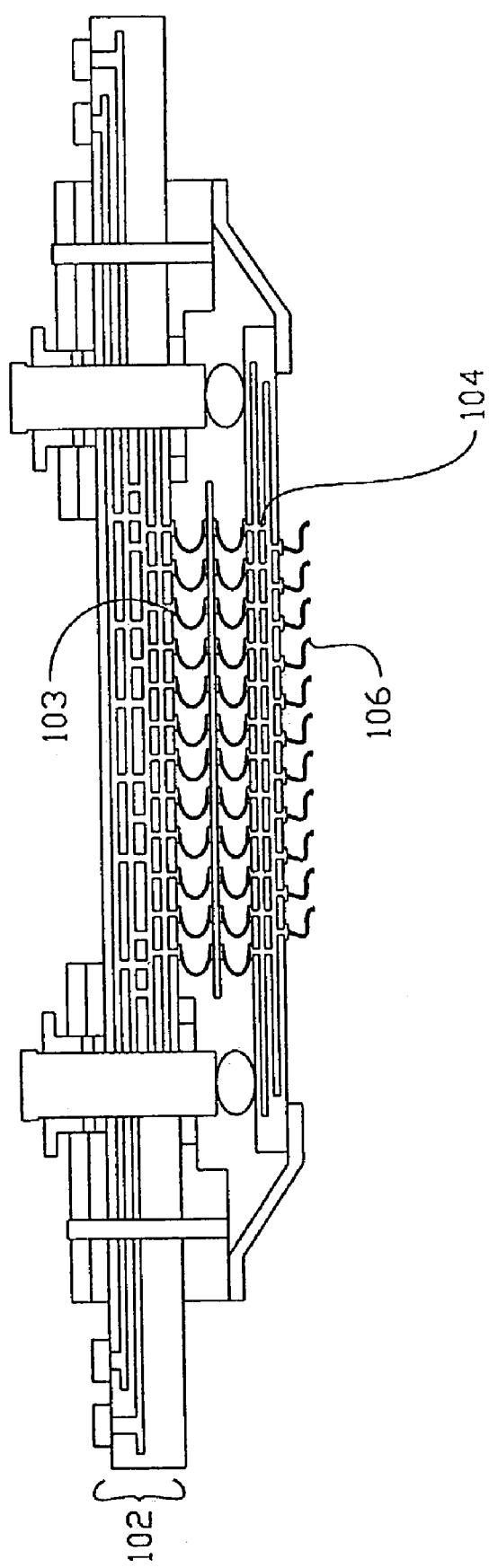
FIG. 1 shows a conventional flip chip wafer probe card.
Figure 2:
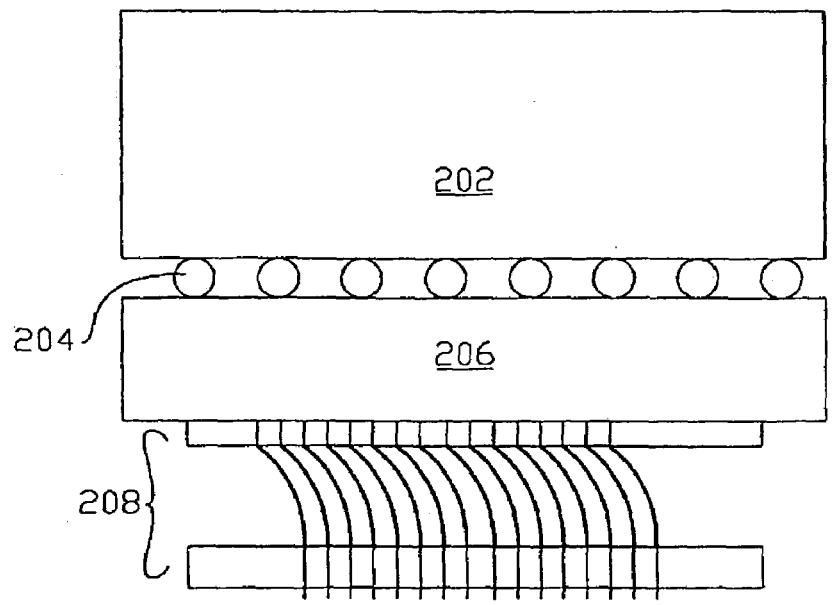
FIG. 2 shows another conventional flip chip wafer probe card.
Figure 3:
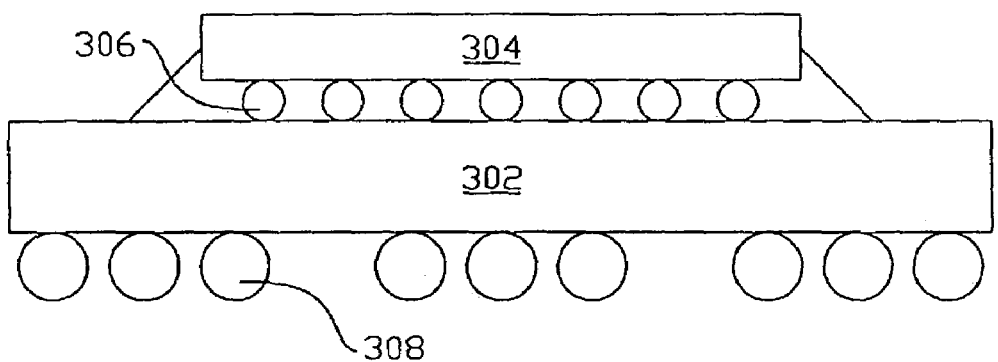
FIG. 3 shows a cross-sectional view of a flip chip package structure.
Figure 4:
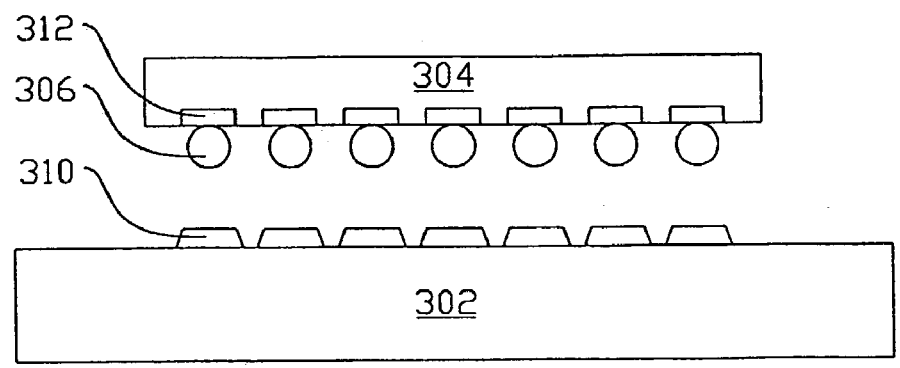
FIG. 4 shows a chip and a substrate.

FIG. 3 shows a cross-sectional view of a flip chip ball grid array package structure. The flip chip package structure comprises a "flipped" chip 304 and a substrate 302. The substrate 302 is used as a chip carrier and to distribute signals from the chip 304 to solder balls 308 which have a larger pitch fitting the chip 304 for the requirement of printed circuit board. The chip 304 connects to the substrate 302 by conductors 306. FIG. 4 shows the chip 304 and the substrate 302 before bonding and underfill processes. The chip 304 is bonded to the substrate 302 via the soldering between the conductors 306 and circuit traces 310. Accordingly, the conductors 306 of the chips 304 and the circuit traces 310 on the substrate 302 are designed and formed to align with each other. The conductors 306 are formed on bonding pads 312 and thus the bonding pads 312 are also designed and formed to align with the circuit traces 310. The conductors 306 comprise solder bumps. The substrate of flip chip package has one function the same as the transformers 104 and 206. For example, the substrate 302 is also used to distribute signals from the chip 304 to the solder balls 308 which have a larger pitch in order to match and to be mounted on a printed circuit board. Thus the side of the substrate 302 used to bond with the solder balls 308 can be utilized to contact with the printed circuit board of the wafer probe card through proper contactor devices. Moreover, since the circuit traces 310 of the substrate 302 match the bonding pads 312 of the chip 304, the side of the substrate 302 having the circuit traces 310 can be used to contact with the chip 304 through proper contactor devices such as springs, pins and probes. The substrate 302 has a multi-level interconnect structure therein to distribute signals from the chip 304 to a printed circuit board similar to the circuit of the transformers 104 and 206. Therefore, a conventional transformer of a flip chip wafer test probe card can be replaced with a flip chip substrate.

Conventionally, when the chip 304 is tested, the probes 106 and the probe frame 208 align with and contact the bonding pads 312 of the chip 304. The substrate 302 used to carrier the chip 304 in flip chip package can also be used to replace the transformers 104 and 206 since the substrate 302 has circuit trace pads 310 which are designed and formed to align with the bonding pads 312 of the chips. Probes or probe frame as the probes 106 and the probe frame 206 can be utilized on the substrate 302 to contact the bonding pads 312 of the chip 304. Solders or mechanical devices such as springs and pins can also be formed on the circuit trace pads 310 of the substrate 302 to contact the bonding pads 312. The substrate 302 is produced in a huge quantity to be used in flip chip package to carrier the chip 304 so that it is quite convenient and with ample supply to replace the conventional transformer which is designed and built specifically with a very limited quantity and a long design cycle time and is much expensive compared to a substrate used in flip chip package. Furthermore, the substrate 302 can be made of organic materials which are low cost while the conventional transformers are made of ceramics which are expensive and the manufacturing tooling of the ceramic transformer is also expensive.

Figure 5:
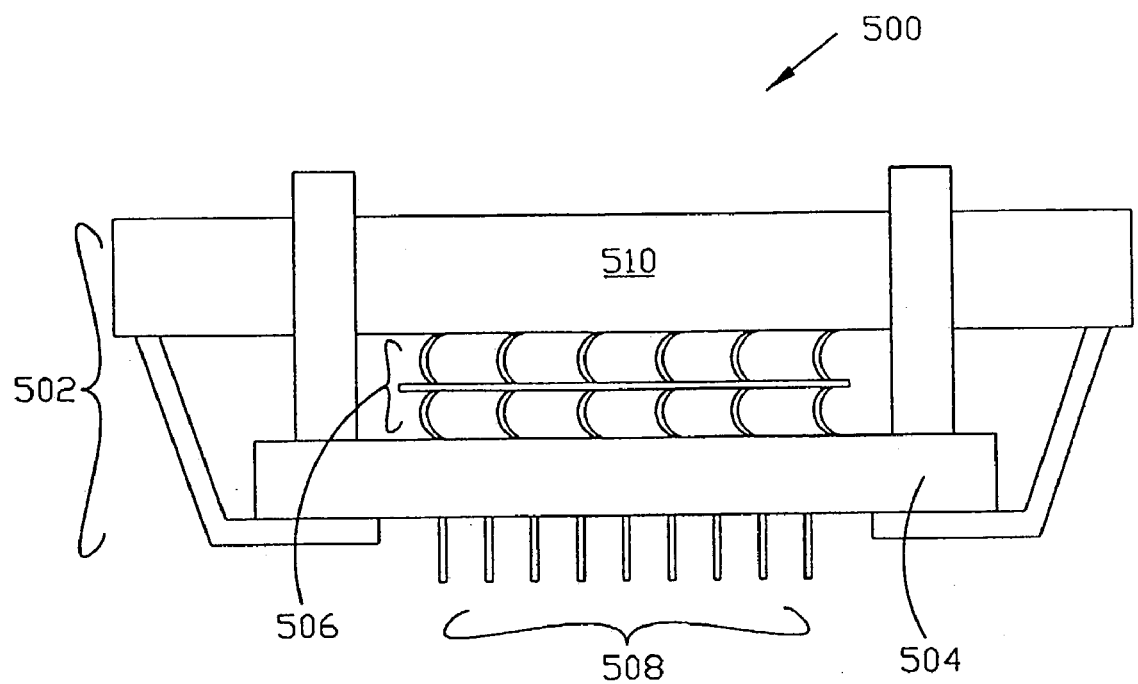
FIG. 5 shows a flip chip test structure.
Figure 6:
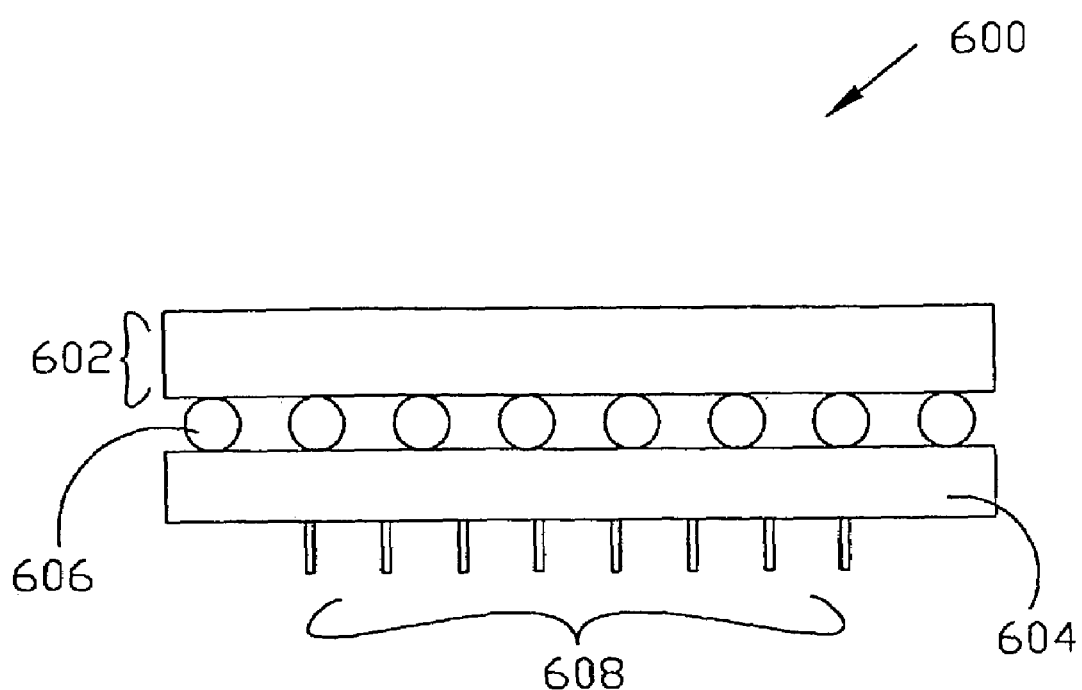
FIG. 6 shows another flip chip test structure.

FIG. 5 shows a flip chip test structure 500 having a substrate 504 which is used in flip chip package. As shown in FIG. 5, the flip chip test structure 500 also has a means for holding substrate, communicating signal 502 and contactor devices 506 and 508. The means for holding substrate and communicating signal 502 comprises PCB 510 therein which communicate signals between the substrate 504 and a testing equipment through the contactor device 506. The means for holding substrate and communicating signal 502 holds the substrate 504 to test chips. The substrate 504 having an interconnect structure which communicates signals between a tested chip and the substrate 504 through the contactor device 508 and distribute the signals from the contactor device 508 with a small pitch to the contactor device 506 with a large pitch. The pitch of the contactor device 508 matches the pitch of bonding pads of a chip being tested while the pitch of the contactor device 506 matches the pitch of the solder balls of the substrate 504 which are used to contact and bond with a printed circuit board or a main board. The contactor device 506 comprises solder balls or mechanical devices such as springs. The contactor device 508 comprises probes, springs or pins. The contactor devices 508 contact bonding pads of a tested chip and communicate the chip and the substrate 504. The means for holding substrate and communicating signal comprises a printed circuit board used in chip testing. This printed circuit board has similar function to communicate signals between chip and PCB. The printed circuit board also aligns signal pads to transformer. On the other side of the PCB, the signal contact mechanism is designed to general test equipment. This printed circuit board can be replaced by load board which is typically used in IC final testing. The load board in general is also designed to optimize for electrical performance. FIG. 6 shows another flip chip test structure 600 having a substrate 604 which is used in flip chip package. The flip chip test structure 600 also has a PCB 602 and contactor devices 606 and 608.

The invention provides a flip chip test structure which utilizes a substrate of flip chip package to replace the conventional transformer. It further utilizes load board to replace PCB. The substrate is available, ready-to-use and low cost while the transformer must be particularly designed and built for each kind of chip being tested and with a very few quantity and a long design cycle time. Moreover, the chip-testing cost is further reduced since the transformer is made of ceramics which is expensive and the manufacturing tooling of the ceramic transformer is also expensive. The load board is also available for IC final test while separate PCB has similar cycle time and cost penalty like transformer.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claim is:

1. An apparatus comprising:
a substrate used in flip chip package incorporated into a flip chip test structure, wherein said substrate contacts and communicates with a chip disposed at an outer side thereof and distributes test signals from a chip being tested;
means for holding substrate and communicating signal extending over an inner side of said substrate, said means for holding said substrate and communicating signal transmits said distributed test signals from said substrate to a test apparatus; and
contactor devices communicating said substrate and said means for holding substrate and communicating signal.

2. The apparatus according to claim 1, wherein said contactor devices comprise probes.

3. The apparatus according to claim 1, wherein said contactor devices comprise pins.

4. The apparatus according to claim 1, wherein said contactor devices comprise springs.

5. The apparatus according to claim 1, wherein said means for holding substrate and communicating signal comprises a printed circuit board of a flip chip wafer probe card.

6. The apparatus according to claim 1, wherein said means for holding substrate and communicating signal comprises a load board.

7. The apparatus according to claim 1, wherein said substrate is made of organic material.

8. An apparatus comprising:
a substrate used in flip chip package incorporated into a flip chip test structure, wherein said substrate contacts and communicates with a chip disposed at an outer side thereof and distributes test signals from a chip being tested;

a load board extending over an inner side of said substrate for holding said substrate and communicating signal transmits said distributed test signals from said substrate to a test apparatus; and contactor devices communicating said substrate and said load board.

9. The apparatus according to claim 8, wherein said contactor devices comprise probes.

10. The apparatus according to claim 8, wherein said contactor devices comprise pins.

11. The apparatus according to claim 8, wherein said contactor devices comprise springs.

12. The apparatus according to claim 8, wherein said substrate is made of organic material.

13. The apparatus according to claim 8, wherein said load board is used for final testing.

14. The apparatus according to claim 13, wherein said load board has the same signal arrangement as probe card PCB for final testing.

15. The apparatus according to claim 8, wherein said load board has the same signal arrangement as said substrate.

* * * * *